US011252833B2

(12) United States Patent
Yen et al.

(10) Patent No.: US 11,252,833 B2
(45) Date of Patent: Feb. 15, 2022

(54) FOLDABLE ELECTRONIC DEVICE AND HINGE MODULE THEREOF

(71) Applicant: SYNCMOLD ENTERPRISE CORP., New Taipei (TW)

(72) Inventors: Ching-Hui Yen, New Taipei (TW); Chien-Cheng Yeh, New Taipei (TW); Chun-Hao Huang, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 17/015,786

(22) Filed: Sep. 9, 2020

(65) Prior Publication Data

US 2021/0076520 A1 Mar. 11, 2021

Related U.S. Application Data

(60) Provisional application No. 62/898,173, filed on Sep. 10, 2019.

(51) Int. Cl.
*H05K 7/02* (2006.01)
*H05K 7/04* (2006.01)
*H05K 5/02* (2006.01)
*H05K 5/00* (2006.01)

(52) U.S. Cl.
CPC ......... *H05K 5/0226* (2013.01); *H05K 5/0017* (2013.01)

(58) Field of Classification Search
USPC .......................................................... 361/807
See application file for complete search history.

(56) References Cited

U.S. PATENT DOCUMENTS

| 3,483,588 A * | 12/1969 | Hover | B63B 19/203 |
| | | | 16/354 |
| 10,423,019 B1 * | 9/2019 | Song | G06F 1/1681 |
| 11,044,825 B1 * | 6/2021 | Han | H05K 5/0017 |
| 2016/0227645 A1 * | 8/2016 | Hampton | G06F 1/1616 |
| 2017/0235337 A1 * | 8/2017 | Vic | E05D 11/00 |
| | | | 361/679.55 |
| 2021/0200277 A1 * | 7/2021 | Park | E05D 3/122 |

* cited by examiner

*Primary Examiner* — Hung S. Bui
(74) *Attorney, Agent, or Firm* — Muncy, Geissler, Olds & Lowe, P.C.

(57) ABSTRACT

A hinge module and a foldable electronic device comprising the same are disclosed. The hinge module comprises a support piece. The foldable electronic device comprises a central body, a first panel body, a second panel body, and a flexible screen. When the first panel body and the second panel body are in an unfolded state, the flexible screen is flattened and the support piece is located at the first position for the supporting surface abutting against the bendable area of the flexible screen; and when the first panel body and the second panel body are in a folded state, the bendable area is bent, the support piece is located at the second position, and the support piece, the first panel body, and the second panel body collaboratively form a receiving space for accommodating the bendable area of the flexible screen.

17 Claims, 11 Drawing Sheets

FOLDABLE ELECTRONIC DEVICE AND HINGE MODULE THEREOF

CROSS REFERENCE TO RELATED APPLICATION

This application claims benefit of U.S. Provisional Application Ser. No. 62/898,173, filed on Sep. 10, 2019. The entirety of the Application is incorporated herein by reference.

BACKGROUND OF THE INVENTION

1. Field of the Invention

The present invention relates to a hinge module, particularly a hinge module used for a foldable electronic device.

2. Description of Related Art

A foldable electronic device is normally provided with a hinge module for folding purposes. However, a bendable area of a flexible screen of the foldable electronic device is usually mounted on a place aligned to the hinge module. Accordingly, when the foldable electronic device is in an unfolded state, the hinge module should be compatible with other elements to keep the flexible screen in a flat state; however, when the foldable electronic device is in a folded state, the hinge module should be compatible with other elements and provides a receiving space for accommodating the bendable area to prevent the bendable area from being damaged.

Current designs use multiple gear sets to achieve the aforesaid purposes, however, a novel hinge module is adapted in the present invention, in which a support piece of the hinge module is driven by a combination of gears and a rack and also has a function of supporting the bendable area. The hinge module can also avoid the bendable area from being damaged as well.

SUMMARY OF THE INVENTION

One of the main objects of the present invention is to provide a foldable electronic device and a hinge module thereof, wherein a support piece of the hinge module is adapted to move as the foldable electronic device is being folded. Besides, according to the extent of bending in a bendable area of a flexible screen, the support piece, a first panel body, and a second panel body can collaboratively form a suitable receiving space for accommodating the bendable area.

Another object of the present invention is to provide support for the bendable area through the movable support piece of the hinge module. The bendable area can always be supported in any bending level whether the foldable electronic device is in a folded or unfolded state.

To achieve the objects above, the present invention provides a hinge module and a foldable electronic device comprising the hinge module. The foldable electronic device comprises at least one hinge module, a central body, a first panel body, a second panel body, and a flexible screen. The hinge module comprises two shafts, two gear members, a rack, and a support piece, wherein the shafts are disposed at the central body, the gear members are sleeved on the shafts respectively, the rack is clamped between the gear members to engage with the gear members, and the support piece is disposed at the central body to connect with the rack, and has a supporting surface. The support piece moves between a first position and a second position along with the rack when the gear members rotate. The first panel body is connected to one of the gear members so as to rotate with respect to the central body, while the second panel body is connected to the other one of the gear members so as to rotate with respect to the central body. The flexible screen is disposed on the first panel body and the second panel body and has a bendable area. Therefore, when the first panel body and the second panel body are in an unfolded state, the flexible screen is flattened and the support piece is located at the first position for the supporting surface abutting against the bendable area of the flexible screen; and when the first panel body and the second panel body are in a folded state, the bendable area is bent, the support piece is located at the second position, and the support piece, the first panel body and the second panel body collaboratively form a receiving space for accommodating the bendable area of the flexible screen.

The central body has a housing. When an external force is applied to convert the first panel body and the second panel body from the unfolded state to the folded state, the support piece approaches the housing along an axis from the first position and moves to the second position; and when an external force is applied to convert the first panel body and the second panel body from the folded state to the unfolded state, the support piece moves away from the housing along the axis from the second position and moves to the first position.

Furthermore, each of the gear members has a gear body and a board body connected to the gear body, and the board bodies are respectively connected to the first panel body and the second panel body. Besides, each of the gear bodies has a gear and a protrusion, the gear is fixed to the protrusion; and each of the board bodies is provided with an inserting hole for the protrusion engaged therein correspondingly. In other words, each of the protrusions has a first cross section and each of the inserting holes has a second cross section that matches with the first cross section. Each of the protrusions is formed with a through groove for the shaft being inserted therein.

Besides, when the first panel body and the second panel body are in the unfolded state, the receiving space is defined to have a minimum volume; and when the first panel body and the second panel body are in the folded state, the receiving space is defined to have a maximum volume.

Also, when the first panel body and the second panel body are in the folded state, the bendable area abuts against the supporting surface.

When an external force is applied to rotate the first panel body or the second panel body with respect to the central body, one of the gear members disposed adjacent thereto rotates correspondingly and drives the rack to move along the axis, the rack then turns the other one of the gear members to rotate so that the second panel body or the first panel body rotates with respect to the central body.

The axis is perpendicular to the supporting surface, and rotation directions of the two gear members are opposite to each other.

The present invention also provides a hinge module used for a foldable electronic device. The foldable electronic device comprises a central body, a first panel body, a second panel body, and a flexible screen provided with a bendable area. The hinge module comprises two shafts, two gear members, a rack, and a support piece. The shafts are disposed at the central body, the gear members are sleeved on the shafts respectively, the rack is being clamped between the gear members to engage with the gear members, and the support piece is disposed at the central body to connect with the rack and has a supporting surface. The support piece moves between a first position and a second position along with the rack when the gear members rotate. Furthermore, the first panel body is connected to one of the gear members so as to rotate with respect to the central body; the second panel body is connected to the other one of the gear members so as to rotate with respect to the central body; and the flexible screen is disposed on the first panel body and the second panel body. When the first panel body and the second panel body are in an unfolded state, the flexible screen is flattened and the support piece is located at the first position for the supporting surface abutting against the bendable area of the flexible screen; and when the first panel body and the second panel body are in a folded state, the flexible screen is bent, the support piece is located at the second position, and the support piece, the first panel body, and the second panel body collaboratively form a receiving space for accommodating the bendable area of the flexible screen.

Also, when an external force is applied to convert the first panel body and the second panel body from the unfolded state to the folded state, the support piece approaches to the central body along an axis from the first position and moves to the second position; and when an external force is applied to convert the first panel body and the second panel body from the folded state to the unfolded state, the support piece moves away from the central body along the axis from the second position and moves to the first position.

Each of the gear members has a gear body and a board body connected to the gear body, and the board bodies are respectively connected to the first panel body and the second panel body.

Each of the gear bodies has a gear and a protrusion, the gear is fixed to the protrusion, and each of the board bodies is provided with an inserting hole for the protrusion being engaged therein correspondingly. Furthermore, each of the protrusions has a first cross section and each of the inserting holes has a second cross section that matches the first cross section. Each of the protrusions is formed with a through groove for the shaft being inserted therein.

Thus, when the first panel body and the second panel body are in the unfolded state, the receiving space is defined to have a minimum volume; and when the first panel body and the second panel body are in the folded state, the receiving space is defined to have a maximum volume.

Furthermore, when an external force is applied to rotate any one of the first panel body or the second panel body with respect to the central body, the gear member disposed adjacent thereto rotates correspondingly and drives the rack to move along the axis, the moving rack then turns the other one of the gear member to rotate, thereby driving the second panel body or the first panel body to rotate with respect to the central body.

The axis is perpendicular to the supporting surface, and rotation directions of the two gear members are opposite to each other.

DETAILED DESCRIPTION OF THE PREFERRED EMBODIMENT

Figure 1:
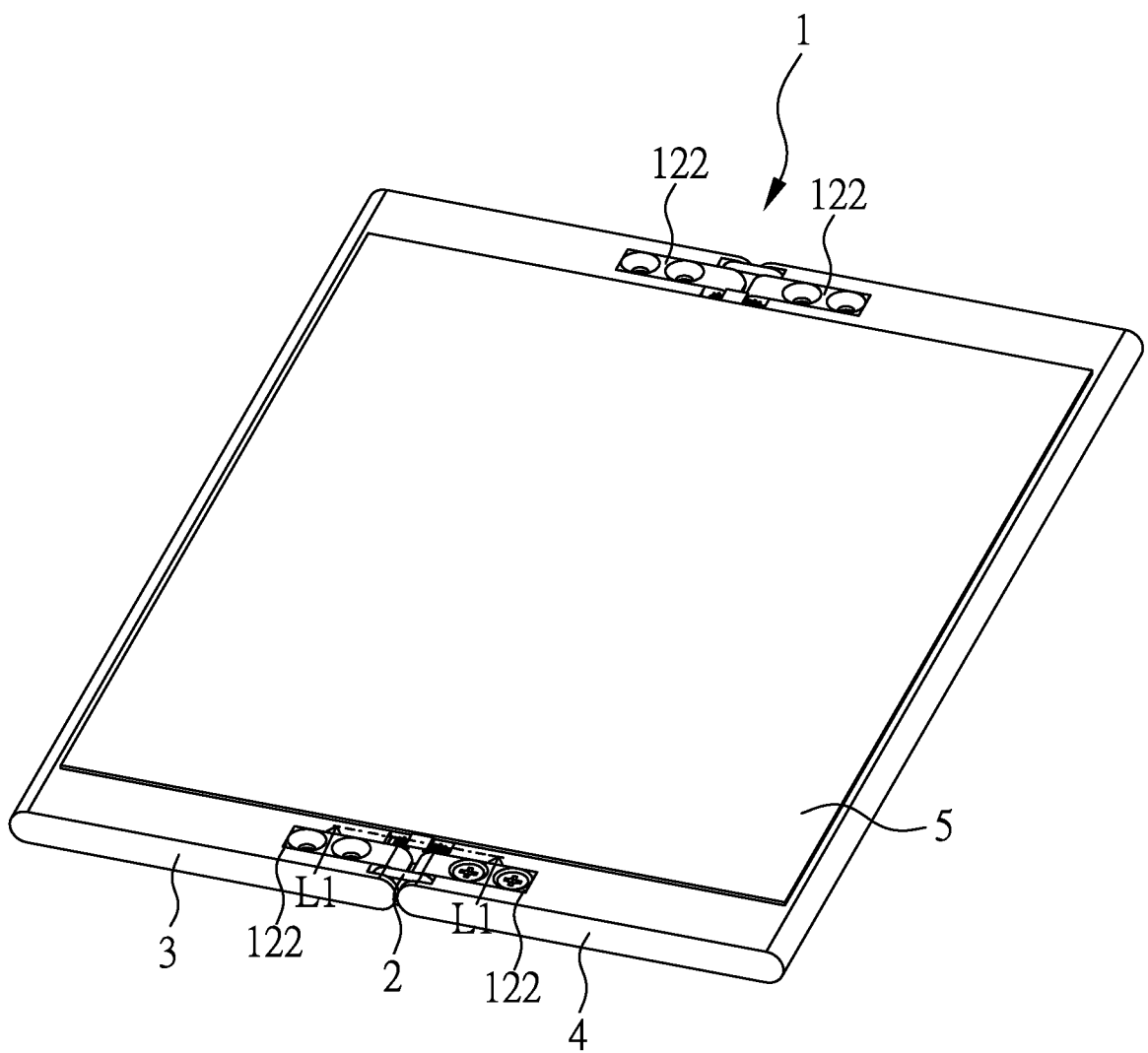
FIG. 1 is a perspective schematic view showing a foldable electronic device in an unfolded state of the present invention.
Figure 2:
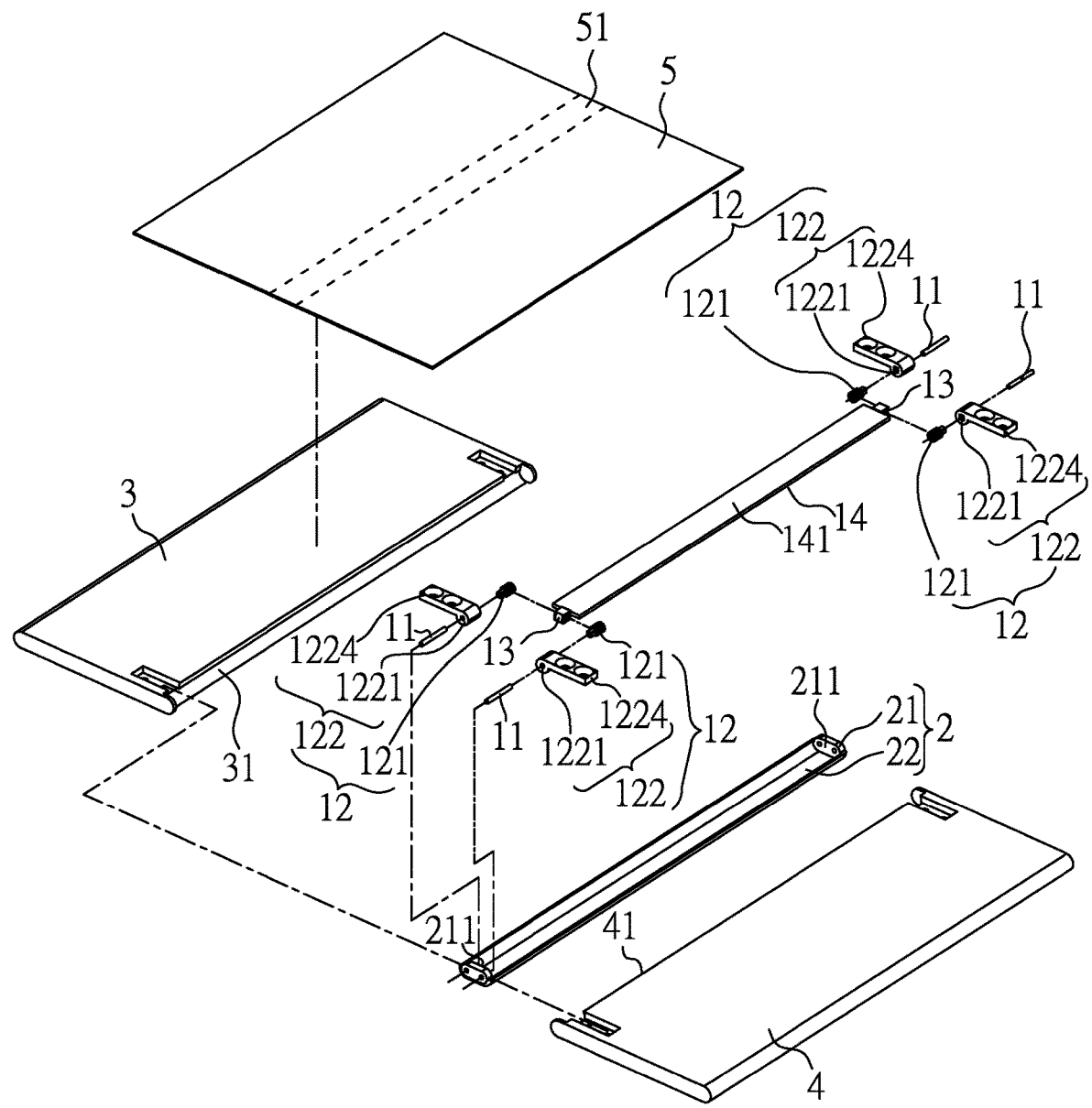
FIG. 2 is an exploded view showing a foldable electronic device and a hinge module of the present invention.

FIGS. 1 and 2 illustrate an exemplary embodiment of a foldable electronic device 1000 of the present invention. The foldable electronic device 1000 comprises two sets of hinge modules 1, a central body 2, a first panel body 3, a second panel body 4, and a flexible screen 5. The two sets of hinge modules 1 are disposed opposite to each other on the central body 2. The first panel body 3 is connected to the hinge modules 1 and is rotatable with respect to the central body 2 while the second panel body 4 is connected to the hinge modules 1 and is rotatable with respect to the central body 2. The flexible screen 5 is disposed on the first panel body 3 and the second panel body 4. The first panel body 3 and the second panel body 4 referred to herein comprise a case, a battery, a circuit board, and other related electronic components, and the components mentioned above are electrically connected to the flexible screen 5, respectively.

The connections of components are explained as follows. Each of the hinge modules 1 comprises two shafts 11, two gear members 12, a rack 13, and a support piece 14. The central body 2 comprises a housing 21 and an accommodating space 22 defined by the housing 21, and each of the hinge modules 1 is partially disposed in the accommodating space 22. The housing 21 has two side walls 211 facing to each other, the pair of shafts 11 of each hinge modules 1 are spaced apart from each other and being fixed to the side walls 211 while each of the gear members 12 is correspondingly sleeved on each of the shafts 11. Furthermore, in each hinge modules 1, the rack 13 is clamped between the gear members 12 and engages with the gear members 12, and the support piece 14 is connected to the rack 13 and has a supporting surface 141 adjacent to the flexible screen 5. In the embodiment, the support pieces 14 of the two hinge modules 1 are connected to each other and formed as a single unit that is connected between the racks 13 of the two hinge modules 1. Therefore, when each of the gear members 12 correspondingly rotates about each of the shafts 11, the racks 13 are driven to move and thus the support piece 14 is converted between the different positions along with the racks 13.

It should be noted that, in the embodiment, the shafts 11 are fixed to the side walls 211, and the gear members 12 are rotated about the shafts 11. However, in other embodiments, the shafts 11 can also be rotatably connected to the side walls 211. Under the circumstance, each of the gear members 12 and each of the shafts 11 rotate relative to the housing 21 at the same time about an axis of each of the shafts 11.

Figure 3:
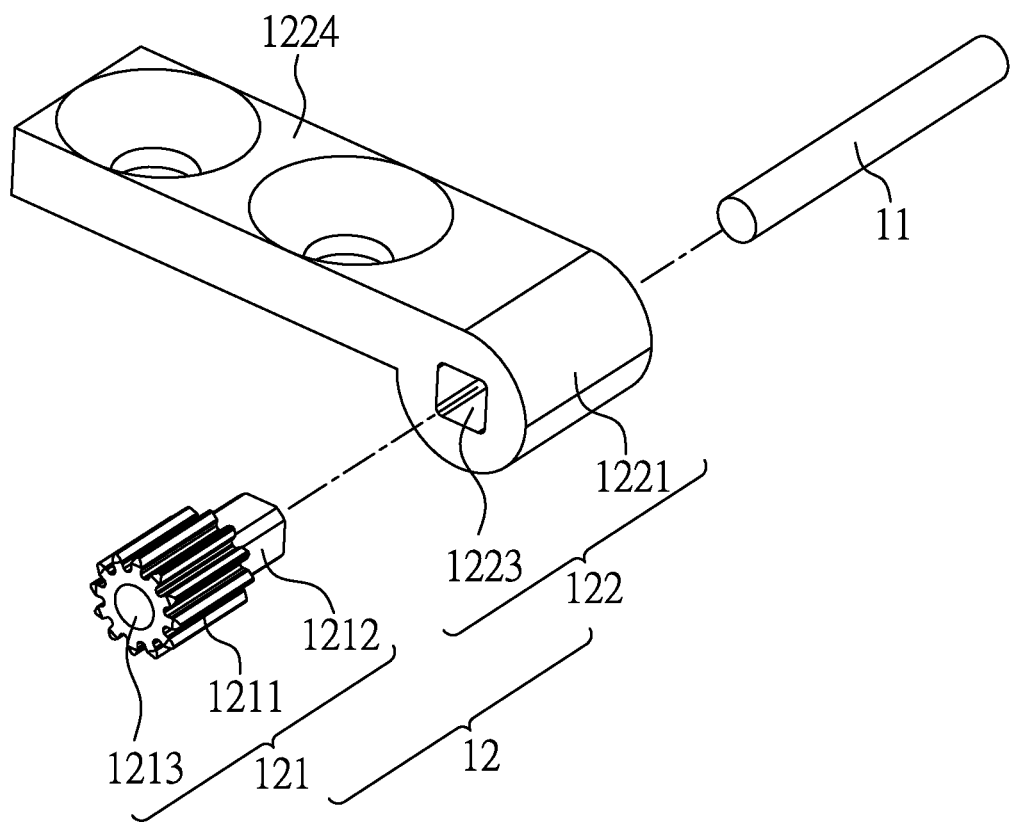
FIG. 3 is an exploded view showing gear members, board bodies, and shafts of a hinge module of the present invention.
Figure 4:
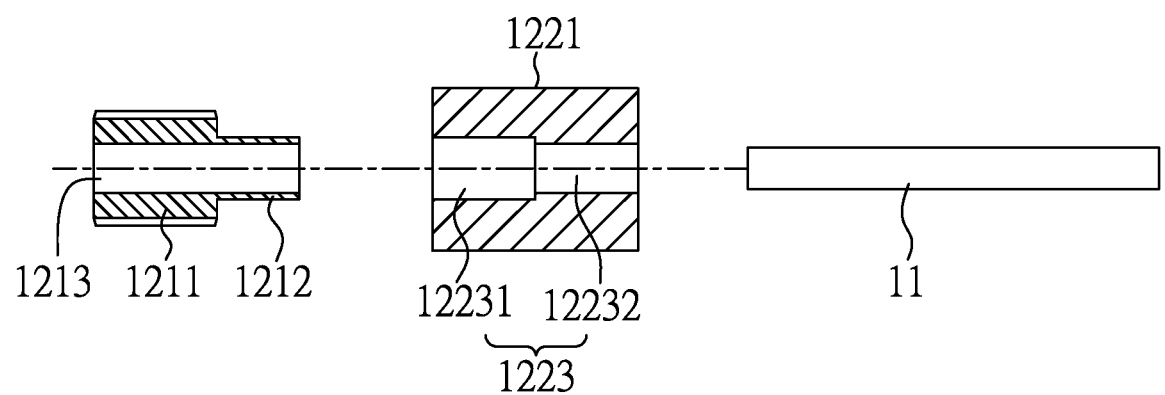
FIG. 4 is a cross-sectional view of FIG. 3.

In detail, as shown in FIGS. 3 and 4, each gear member 12 has a gear body 121 and a board body 122 connected to the gear body 121. The gear body 121 has a gear 1211, a protrusion 1212, and a through groove 1213. The gear 1211 and the protrusion 1212 are fixedly connected, and the through groove 1213 is formed through the gear 1211 and the protrusion 1212. Moreover, the board body 122 has a shaft end 1221, an inserting hole 1223, and a fixing end 1224 connected to the shaft end 1221. The inserting hole 1223 is formed at the shaft end 1221, and the protrusion 1212 is correspondingly engaged with an engaging area 12231 of the inserting hole 1223. That is, the protrusion 1212 has a first cross section, the inserting hole 1223 has a second cross section, and the first cross section matches with the second cross section. For example, in the embodiment, the first cross section of the protrusion 1212 is non-circular and roughly square, while the second cross section of the inserting hole 1223 is roughly square that corresponds to the shape of the first cross section and matches with the first cross section. Furthermore, in the embodiment, the inserting hole 1223 is provided with the engaging area 12231 and a penetrating area 12232. The engaging area 12231 has the second cross section for the protrusion 1212 to be correspondingly engaged therein, and the penetrating area 12232 is formed as a circular hole. The shaft 11 passes through the penetrating area 12232 and is placed in the through groove 1213. However, in other embodiment, the penetrating area 12232 may also appear square without limitation.

With reference to FIG. 2, in a set of the hinge module 1, the board bodies 122 of the gear members 12 are connected to the first panel body 3 and the second panel body 4 with their fixing ends 1224, respectively. In this way, the first panel body 3 and the second panel body 4 can both rotate with respect to the central body 2.

Figure 5:
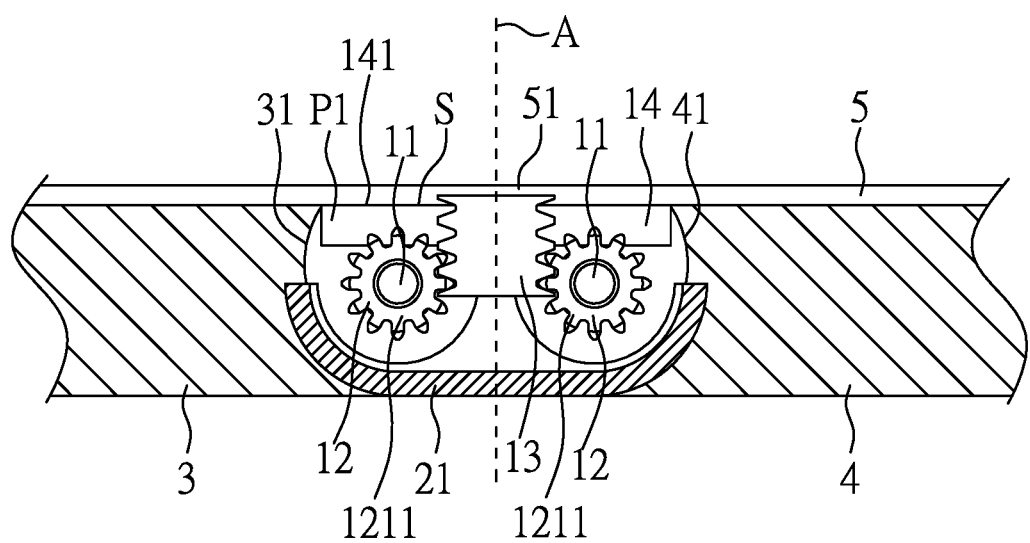
FIG. 5 is a partial section view along the section line L1-L1 in FIG. 1.
Figure 6:
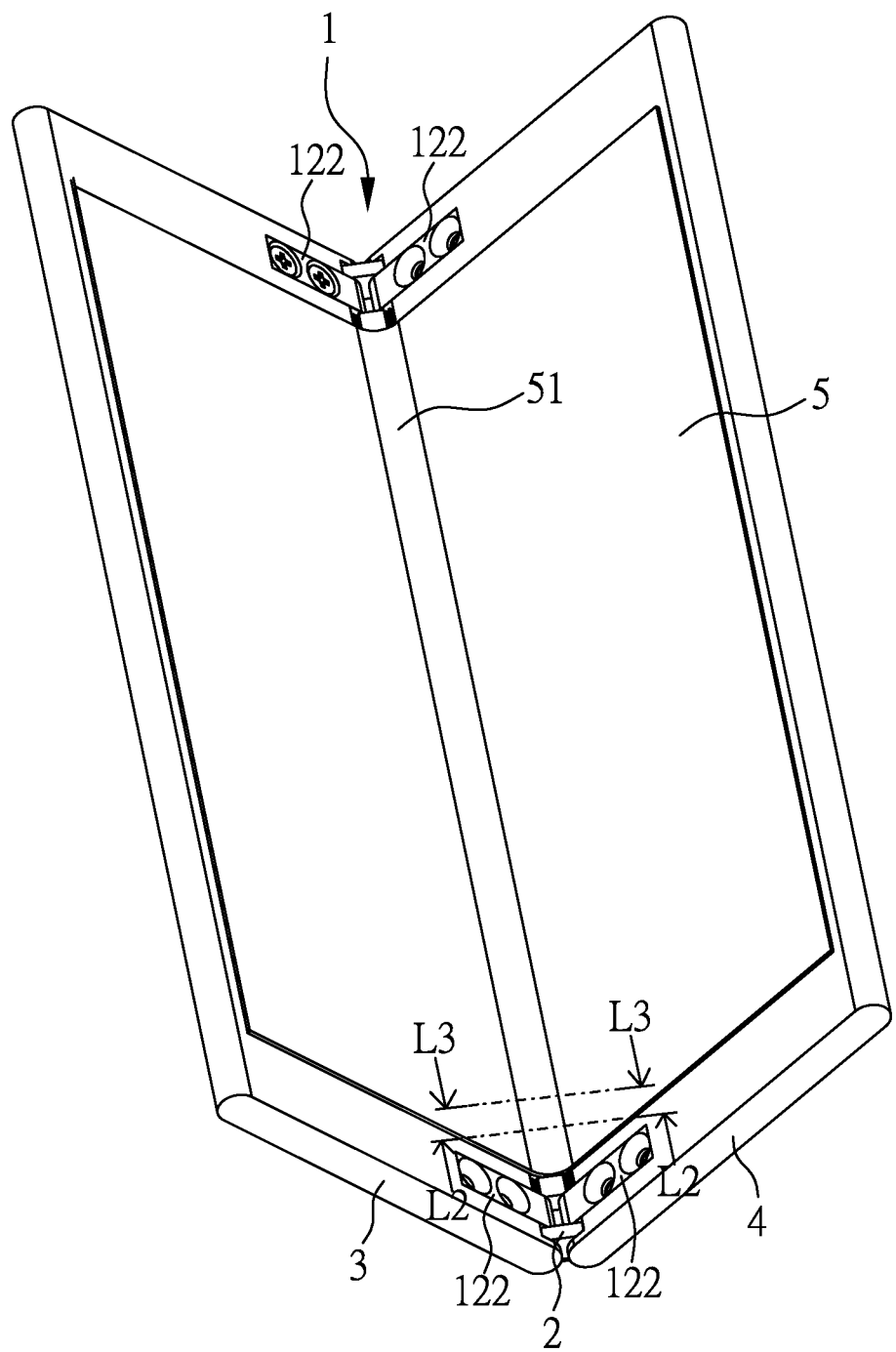
FIG. 6 is a perspective schematic view showing a foldable electronic device and a hinge module in a partially unfolded state of the present invention.
Figure 7:
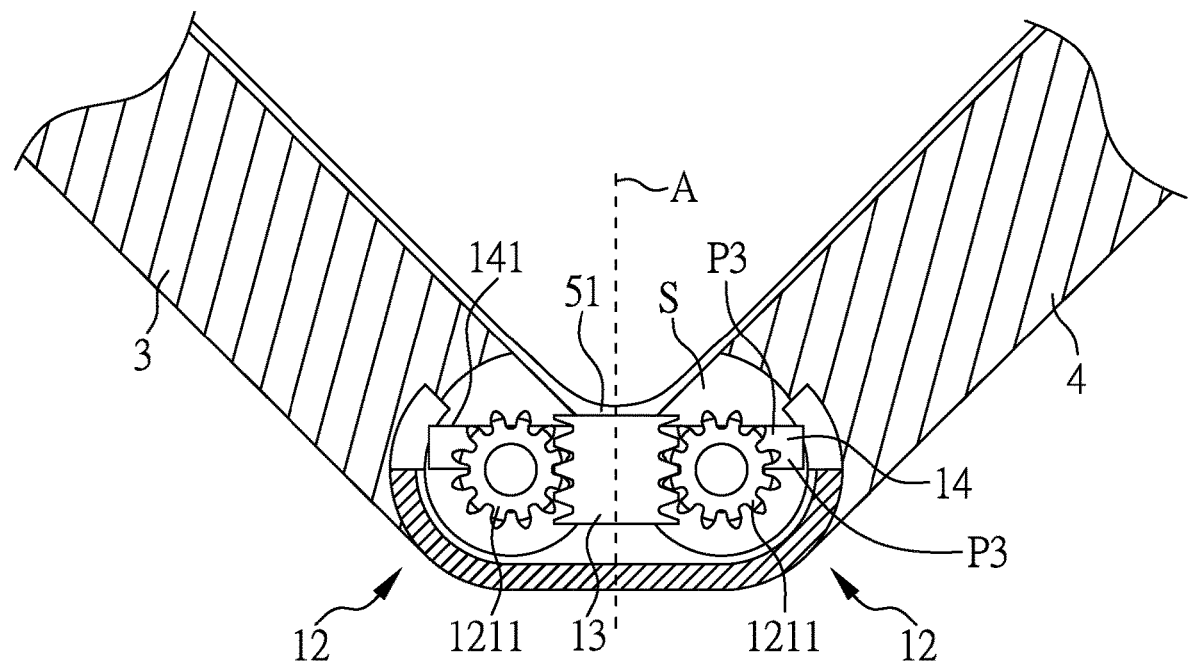
FIG. 7 is a partial section view along the section line L2-L2 in FIG. 6.

Referring to FIGS. 5 to 7, the flexible screen 5 comprises a bendable area 51. The first panel body 3, the second panel body 4, and the support piece 14 collaboratively form a receiving space S for selectively accommodating the bendable area 51. To be more specific, the receiving space S is defined by the first panel body 3, the second panel body 4, and the supporting surface 141 of the support piece 14. In the embodiment, the first panel body 3 and the second panel body 4 are formed with tangent surfaces 31 and 41, respectively (see FIGS. 8 and 10). The tangent surfaces 31 and 41 are both arc surface so that the volume of the receiving space S can be increased. However, in other embodiments of the present invention, the tangent surfaces may be other shapes or may be omitted as desired.

Figure 8:
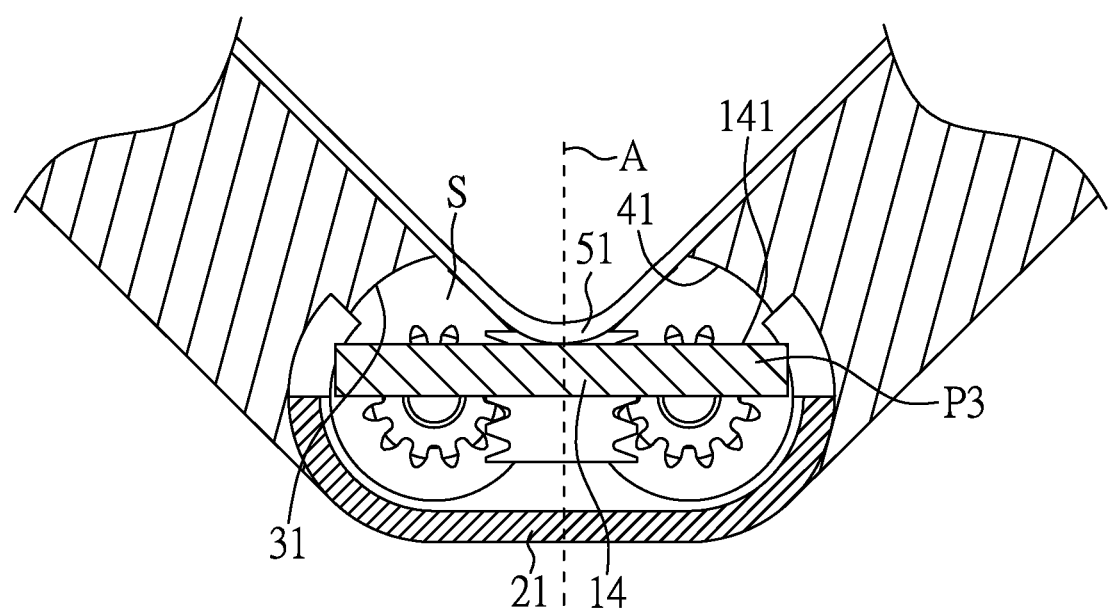
FIG. 8 is a partial section view along the section line L3-L3 in FIG. 6.

The operation of the hinge module 1 and the foldable electronic device 1000 are described as follows. When an external force is applied, the first panel body 3 and the second panel body 4 can be converted between an unfolded state and a folded state. Meanwhile, the support piece 14 move along an axis A corresponding to a range formed by a first position P1 (see FIGS. 1 and 5) and a second position P2 (see FIGS. 9, 10 and 11), wherein the axis A is perpendicular to the supporting surface 141 of the support piece 14. FIG. 5 is a section view along a section line L1-L1 in FIG. 1, FIGS. 7 and 8 are section views along section lines L2-L2 and L3-L3 in FIG. 6, respectively, and FIGS. 10 and 11 are section views along section lines L4-L4 and L5-L5 in FIG. 9. The operation will be illustrated from two different viewing angles as followed.

In view of the above, as shown in FIGS. 1 and 5, when the first panel body 3 and the second panel body 4 are in an unfolded state, the flexible screen 5 is flattened and the support piece 14 is located at the first position P1. At this time, the support piece 14 is located furthest from the housing 21 based on the axis A. Moreover, the supporting surface 141 of the support piece 14 abuts against the bendable area 51 of the flexible screen 5 (i.e., surface-to-surface contact), while the rest of the flexible screen 5 is supported by the first panel body 3 and the second panel body 4. In other words, the first panel body 3, the second panel body 4, and the support piece 14 are approximately flat for the flexible screen 5 being supported thereon. Furthermore, in the unfolded state, the receiving space S is defined to have a minimum volume that approaches zero. Herein, the supporting surface 141 of the support piece 14 and the bendable area 51 of the flexible screen 5 are in surface-to-surface contact, which not only provides an excellent support but also allows the user to touch the bendable area 51 freely without any undesirable distortion of image displayed on the bendable area 51.

During the process of applying an external force to convert the first panel body 3 and the second panel body 4 from the unfolded state to the folded state (see FIGS. 6, 7 and 8), the board bodies 122 connected to the first panel body 3 are driven to rotate about the shafts 11 when the first panel body 3 rotates with respect to the central body 2, and the gear members 12 connected to the board bodies 122 are also being driven to rotate, thereby driving the racks 13 to move along the axis A. Then, driven by the movement of the racks 13, the gear members 12 connected to the second panel body 4 rotate, and a direction of the rotation is opposite to the direction of the rotation of the gear members 12 connected to the first panel body 3. As a result, the second panel body 4 can rotate with respect to the central body 2. Namely, through the engagement between the gears 1211 and the racks 13, the first panel body 3 and the second panel body 4 can rotate synchronously during operation. Similarly, if the external force is only applied on the second panel body 4 to rotate the second panel body 4, the first panel body 3 can also be driven and start to rotate at the same time, and the details are not described herein. Since the racks 13 are connected to the support piece 14, the movement of the racks 13 along the axis A can correspondingly drive the support piece 14 to move along the axis A from the first position P1.

Through the operation above, as shown in FIGS. 6, 7, and 8, the first panel body 3 and the second panel body 4 have been rotated to have an approximate 90-degree angle therebetween. The support piece 14 moves along the axis A and approaches to the housing 21, and at this time, the support piece 14 is located at a transition position P3 between the first position P1 and the second position P2. Since a part of the flexible screen 5 is fixed on the first panel body 3 and the second panel body 4, the bendable area 51 is slightly bent. In order to make the bendable area 51 be bent smoothly without improper squeezing or compression during the process, the support piece 14 moves along the axis A, gradually approaches the housing 21, and arrives to the transition position P3, thereby increasing the volume of the receiving space S that collaboratively defined by the support piece 14, the first panel body 3, and the second panel body 4. It should be noted that in the meanwhile, the bendable area 51 remains abutting against the supporting surface 141.

Figure 9:
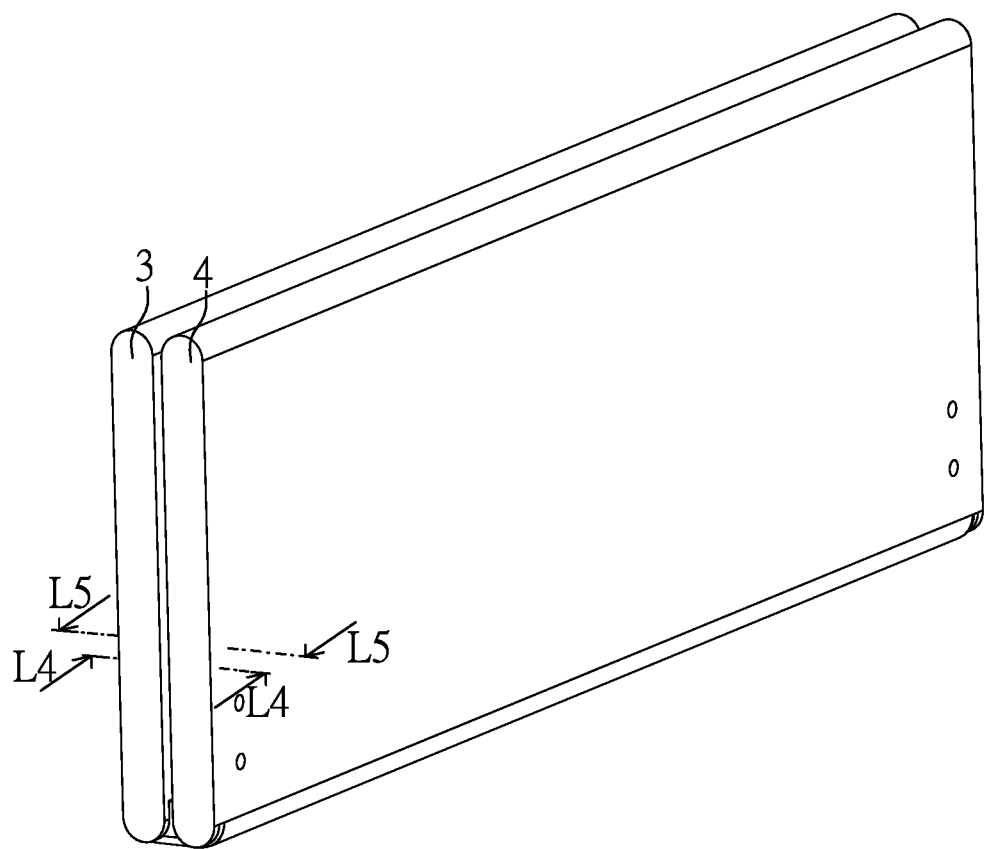
FIG. 9 is a perspective schematic view showing a foldable electronic device and a hinge module in a folded state of the present invention.
Figure 10:
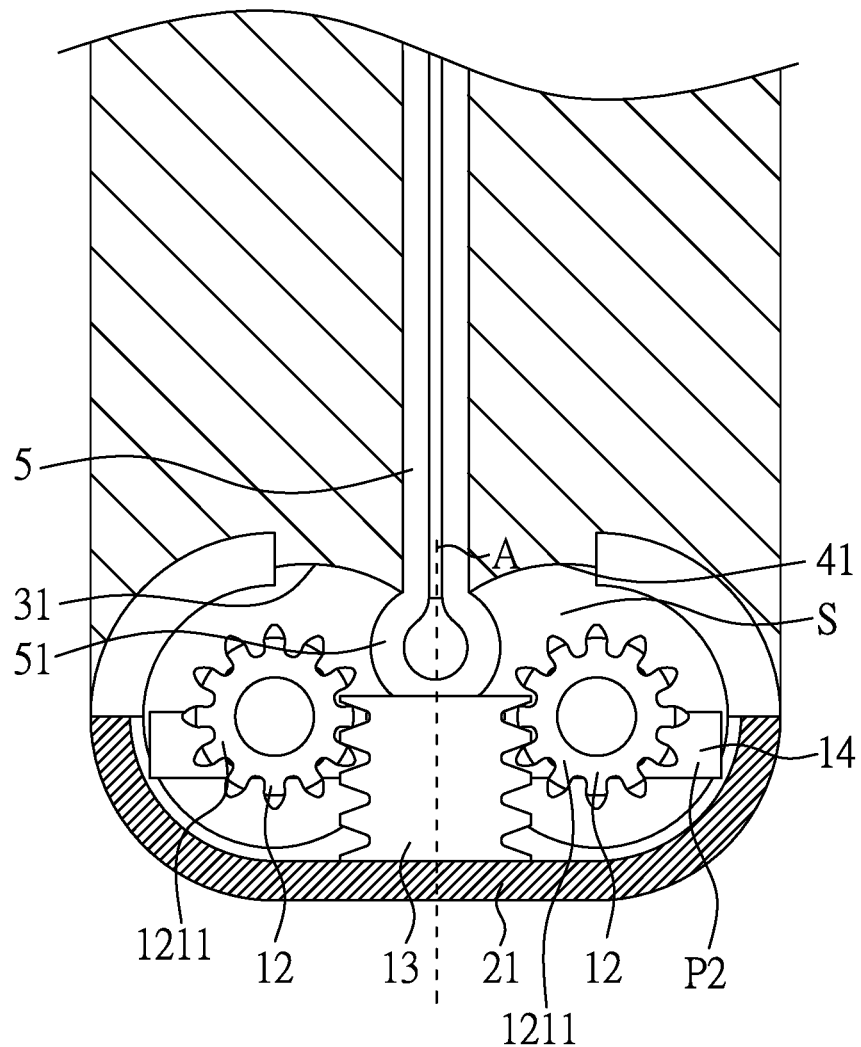
FIG. 10 is a partial section view along the section line L4-L4 in FIG. 9.
Figure 11:
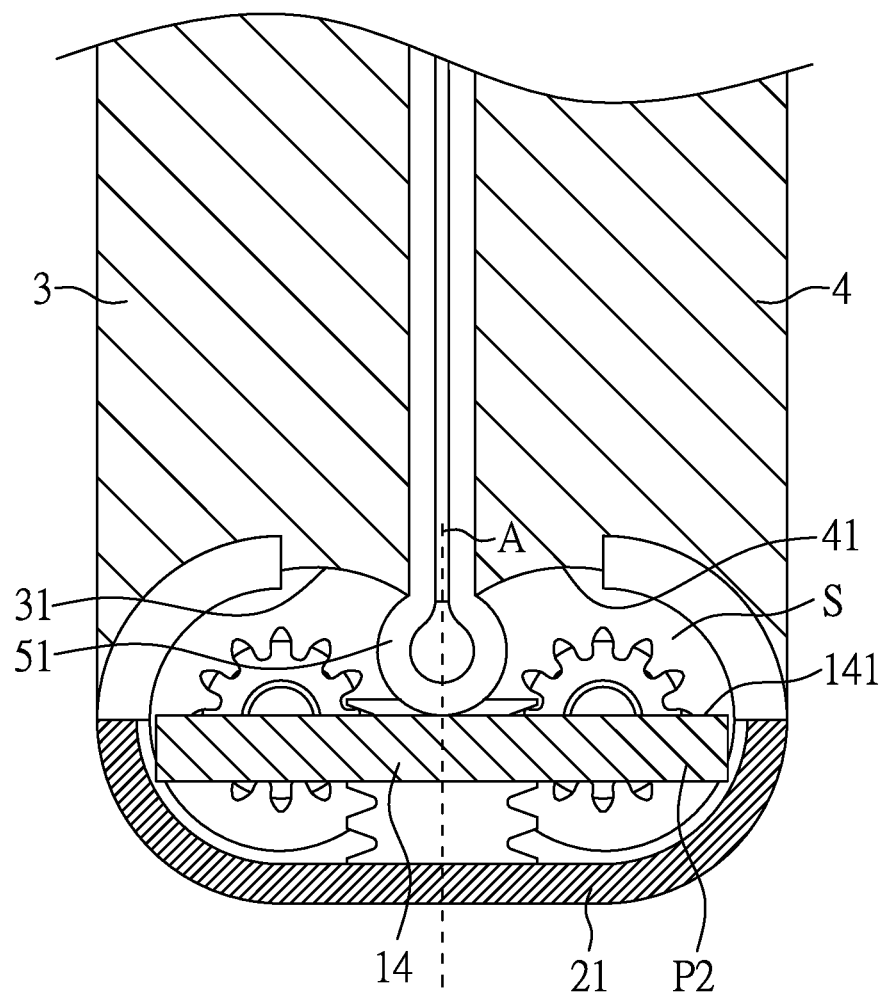
FIG. 11 is a partial section view along the section line L5-L5 in FIG. 9.

As the external force is continuously applied to convert the first panel body 3 and the second panel body 4 to the folded state, the bendable area 51 is fully bent and has a teardrop-shaped cross section (see FIG. 9, FIG. 10 and FIG. 11). The racks 13 move to the position closest to the housing 21 based on the axis A and the support piece 14 also moves to the second position P2 (the position closest to the housing 21 on the axis A), allowing the volume of the receiving space S to be maximized so as to accommodate the bendable area 51. Notably, the bendable area 51 can still abut against the supporting surface 141 when the bendable area 51 is bent. In addition, by disposing the racks 13 between the gear members 12, the first panel body 3 and the second panel body 4 can be spaced apart from each other, and thus the bent flexible screen 5 can be disposed between the first panel body 3 and the second panel body 4.

Similarly, when the first panel body 3 and the second panel body 4 are in the folded state with respect to each other and would like to convert back to the unfolded state (from FIG. 10 to FIG. 5), an external force is applied on the first panel body 3 or the second panel body 4, the gear members 12 disposed adjacent to the panel body under the external force rotate correspondingly and drive the racks 13 to move, and then the support piece 14 starts from the second position P2 and moves along the axis A away from the housing 21 and finally arrives the first position P1 via the transition position P3. As a result, the volume of the receiving space S is gradually changing from maximum to minimum.

In summary, the present invention is characterized by the fact that the bendable area 51 can be accommodated in the receiving space S defined by the support piece 14, the first panel body 3, and the second panel body 4. Besides, the volume of the receiving space S can be changed correspondingly with the bending state of the bendable area 51 by disposing the racks 13 between the gears 1211 and making the support piece 14 move synchronously with the racks 13. For example, as shown in FIG. 5, when the first panel body 3 and the second panel body 4 are in the unfolded state, the bendable area 51 is flattened and does not require much space for accommodating, and thus, the minimum volume of the receiving space S is defined. Conversely, as shown in FIG. 11, when the first panel body 3 and the second panel body 4 are in the folded state, the bendable area 51 is in a maximum bending state and requires a maximum accommodation, and thus, the receiving space S is correspondingly defined a maximum volume for the bendable area 51 to appropriately protect the bendable area 51.

Therefore, when the first panel body 3 and the second panel body 4 convert from the unfolded state to the folded state, the bending of the bendable area 51 gradually increases, and the volume defined by the receiving space S increases correspondingly. In contrast, when the first panel body 3 and the second panel body 4 convert from the folded state to the unfolded state, the bending of the bendable area 51 gradually decreases, and the volume defined by the receiving space S also decreases accordingly. Furthermore, irrespective of the degree of bending of the bendable area 51, the support piece 14 can be moved to a suitable position to provide support for the bendable area 51, and let the bendable area 51 be able to abut against the supporting surface 141 so as to effectively prevent the bendable area 51 from bending excessively.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A foldable electronic device, comprising:
    a central body having a housing;
    at least one hinge module including:
        two shafts disposed at the central body;
        two gear members sleeved on the shafts respectively;
        a rack being clamped between the gear members and engaging with the gear members; and
        a support piece being disposed at the central body, being connected to the rack, and having a supporting surface, wherein the support piece moves between a first position and a second position along with the rack when the gear members rotate;
    a first panel body connected to one of the gear members so as to rotate with respect to the central body;
    a second panel body connected to the other one of the gear members so as to rotate with respect to the central body; and
    a flexible screen being disposed on the first panel body and the second panel body, and having a bendable area;
    wherein when the first panel body and the second panel body are in an unfolded state, the flexible screen is flattened and the support piece is located at the first position for the supporting surface abutting against and supporting the bendable area of the flexible screen; when an external force is applied to convert the first panel body and the second panel body from the unfolded state to a folded state, the support piece approaches the housing along an axis from the first position and moves to the second position; when the first panel body and the second panel body are in the folded state, the flexible screen is bent, the support piece is located at the second position, and the support piece, the first panel body and the second panel body collaboratively form a receiving space for accommodating the bendable area of the flexible screen; and when an external force is applied to convert the first panel body and the second panel body from the folded state to the unfolded state, the support piece moves away from the housing along the axis from the second position and moves to the first position.

2. The foldable electronic device as claimed in claim 1, wherein each of the gear members has a gear body and a board body connected to the gear body, and the board bodies are respectively connected to the first panel body and the second panel body.

3. The foldable electronic device as claimed in claim 2, wherein each of the gear bodies has a gear and a protrusion, the gear is fixed to the protrusion, and each of the board bodies is provided with an inserting hole for the protrusion engaged therein correspondingly.

4. The foldable electronic device as claimed in claim 3, wherein each of the protrusions has a first cross section and each of the inserting holes has a second cross section that matches with the first cross section correspondingly.

5. The foldable electronic device as claimed in claim 4, wherein each of the protrusions is formed with a through groove for the shaft being inserted therein.

6. The foldable electronic device as claimed in claim 5, wherein when the first panel body and the second panel body are in the unfolded state, the receiving space is defined to have a minimum volume; and when the first panel body and the second panel body are in the folded state, the receiving space is defined to have a maximum volume.

7. The foldable electronic device as claimed in claim 6, wherein when the first panel body and the second panel body are in the folded state, the bendable area abuts against the supporting surface.

8. The foldable electronic device as claimed in claim 1, wherein when an external force is applied to rotate the first panel body or the second panel body with respect to the central body, one of the gear members disposed adjacent thereto rotates correspondingly and drives the rack to move along the axis, the rack then turns the other one of the gear members to rotate so that the second panel body or the first panel body rotates with respect to the central body.

9. The foldable electronic device as claimed in claim 8, wherein the axis is perpendicular to the supporting surface, and rotation directions of the two gear members are opposite to each other.

10. A hinge module, which is used for a foldable electronic device comprising a central body, a first panel body, a second panel body, and a flexible screen provided with a bendable area, wherein the hinge module comprises:
two shafts for being disposed at the central body;
two gear members sleeved on the shafts respectively;
a rack being clamped between the gear members and engaging with the gear members; and
a support piece for being disposed at the central body, being connected to the rack and having a supporting surface, wherein the support piece moves between a first position and a second position along with the rack when the gear members rotate;
wherein when the hinge module is disposed on the foldable electronic device, the first panel body is connected to one of the gear members so as to rotate with respect to the central body, the second panel body is connected to the other one of the gear members so as to rotate with respect to the central body, the flexible screen is disposed on the first panel body and the second panel body, when the first panel body and the second panel body are in an unfolded state, the flexible screen is flattened and the support piece is located at the first position for the supporting surface abutting against and supporting the bendable area of the flexible screen; when an external force is applied to convert the first panel body and the second panel body from the unfolded state to a folded state, the support piece approaches to the central body along an axis from the first position and moves to the second position; when the first panel body and the second panel body are in the folded state, the flexible screen is bent, the support piece is located at the second position, and the support piece, the first panel body and the second panel body collaboratively form a receiving space for accommodating the bendable area of the flexible screen; and when an external force is applied to convert the first panel body and the second panel body from the folded state to the unfolded state, the support piece moves away from the central body along the axis from the second position and moves to the first position.

11. The hinge module as claimed in claim 10, wherein each of the gear members has a gear body and a board body connected the gear body, and the board bodies are respectively connected to the first panel body and the second panel body.

12. The hinge module as claimed in claim 11, wherein each of the gear bodies has a gear and a protrusion, the gear fixedly connected to the protrusion; and each of the board bodies is provided with an inserting hole for the protrusion being engaged therein correspondingly.

13. The hinge module as claimed in claim 12, wherein each of the protrusions has a first cross section and each of the inserting holes has a second cross section that matches the first cross section correspondingly.

14. The hinge module as claimed in claim 13, wherein each of the protrusions is formed with a through groove for the shaft being inserted therein.

15. The hinge module as claimed in claim 14, wherein when the first panel body and the second panel body are in the unfolded state, the receiving space is defined to have a minimum volume; and when the first panel body and the second panel body are in the folded state, the receiving space is defined to have a maximum volume.

16. The hinge module as claimed in claim 10, wherein when an external force is applied to rotate the first panel body or the second panel body with respect to the central body, one of the gear member disposed adjacent thereto rotates correspondingly and drives the rack to move along the axis, the rack then turns the other one of the gear member to rotate so that the second panel body or the first panel body to rotates with respect to the central body.

17. The hinge module as claimed in claim 16, wherein the axis is perpendicular to the supporting surface, and rotation directions of the two gear members are opposite to each other.

* * * * *